United States Patent [19]

Stirniman

[11] Patent Number: 6,099,896
[45] Date of Patent: Aug. 8, 2000

[54] METHOD AND APPARATUS FOR ZONE LUBRICATION OF MAGNETIC MEDIA

[75] Inventor: Michael J. Stirniman, San Jose, Calif.

[73] Assignee: Seagate Technology, Inc., Scotts Valley, Calif.

[21] Appl. No.: 09/101,793

[22] PCT Filed: Jul. 23, 1998

[86] PCT No.: PCT/US98/15303

§ 371 Date: Jul. 23, 1998

§ 102(e) Date: Jul. 23, 1998

[87] PCT Pub. No.: WO99/04909

PCT Pub. Date: Feb. 4, 1999

Related U.S. Application Data

[60] Provisional application No. 60/053,783, Jul. 25, 1997.

[51] Int. Cl.[7] ........................................... B05D 5/12
[52] U.S. Cl. ........................... 427/131; 118/50; 118/500; 118/600; 118/719; 118/720; 427/248.1; 427/294; 427/299; 427/402
[58] Field of Search ................................... 427/131, 248.1, 427/294, 299, 402; 118/50, 500, 600, 719, 720

[56] References Cited

U.S. PATENT DOCUMENTS 5,525,392   6/1996   Baum et al. ........................... 428/65.5

*Primary Examiner*—Bernard Pianalto
*Attorney, Agent, or Firm*—McDermott, Will & Emery

[57] ABSTRACT

Solvent-free lubrication of thin film magnetic media, such as magnetic discs, is implemented by applying collimated and/or non-collimated beams of lubricant molecules, including polymeric lubricants having a known and narrow molecular weight distribution to selected regions of the media surface, such as the landing zone. Embodiments include providing in-situ and on-demand fractionation of polymeric lubricants.

19 Claims, 4 Drawing Sheets

METHOD AND APPARATUS FOR ZONE LUBRICATION OF MAGNETIC MEDIA

CROSS-REFERENCE TO PROVISIONAL APPLICATION

This application claims priority from Provisional Patent Application Ser. No. 60/053,783, filed Jul. 25, 1997, the entire disclosure of which is incorporated herein by reference.

TECHNICAL FIELD

The present invention relates to a method for applying a lubricant film to at least a portion of the surface of a magnetic media, such as a radial band portion of a magnetic disc which includes a landing and take-off area for a read-write head.

BACKGROUND ART

Thin film magnetic disc media are typically lubricated with a perfluoropolyether coating to reduce wear during the lifetime of the discs. Conventionally, a thin lubricant film is applied to the disc surface by dipping the disc into a bath containing a small amount of lubricant, e.g., typically less than about 1% by weight of a perfluoro- or hydrocarbon compound dissolved in a solvent. However, a drawback inherent in this process is the consumption of large quantities of solvent, resulting in increased cost and concern with environmental hazards associated with the presence of solvent vapors in the workplace.

Another drawback attendant upon dip lubrication is the non-selectivity of the method, in that lubricant is applied to the entire disc surface. In some instances, e.g., with zone-textured media having a specific radial band designated for the landing and take-off zone of the read-write head, the lubricant film present on the other portions of the disc surface is unnecessary, wasteful and, in some cases, detrimental to the performance of the head-disc interface.

Yet another drawback associated with the conventional dipping methodology stems from the use of mixtures of long chain polymers having a wide distribution of molecular weights. It is known that the molecular weight of the lubricant has an effect on the mechanical performance of the head-disc interface. In conventional practice, the polymeric lubricant mixtures must be subjected to fractionation before adding the lubricant to the solvent to obtain a fraction having a desired molecular weight distribution, thus adding an additional step and increasing the cost of the process.

Accordingly, there exists a need for technology enabling the application of a lubricant film free of the aforementioned drawbacks of conventional dipping.

SUMMARY OF THE INVENTION

An object of the present invention is a method for applying a thin lubricant film to a magnetic recording medium, such as a magnetic disc, which overcomes the drawbacks and deficiencies of the prior art.

A further object of the present invention is a method for applying a thin film of lubricant to a preselected radial band portion of the surface of a magnetic disc.

Another object of the present invention is a method of applying a thin polymeric lubricant film to a magnetic disc, wherein the lubricant is fractionated in-situ into a material having a narrower weight distribution and lighter mean molecular weight.

A further object of the present invention is an apparatus for applying a thin film of a lubricant to a preselected radial band portion of the surface of a magnetic disc.

A still further object of the present invention is an apparatus for applying a thin film of polymeric lubricant to a magnetic disc, which apparatus vaporizes and fractionates the polymeric lubricant into a material having a narrower molecular weight distribution and lower mean weight prior to application of the lubricant film.

Yet another object of the present invention is an apparatus for applying a thin film of lubricant to a preselected radial band portion of a magnetic disc, which apparatus vaporizes the lubricant material and converts the vaporized lubricant into a molecular beam for application to the preselected radial band portion.

Additional objects, advantages, and other features of the present invention will be set forth in part in the description which follows and in part will become apparent to those having ordinary skill in the art upon examination of the following or may be learned from the practice of the invention. The objects and advantages may be realized and obtained as particularly pointed out in the appended claims.

According to the present invention, the foregoing and other objects are achieved in part by a method for applying a lubricant film to a surface of a magnetic media, which method comprises: vaporizing the lubricant; forming the vaporized lubricant into a beam of vaporized lubricant molecules; and directing the beam towards the surface of the magnetic media.

In a preferred embodiment, the vaporized lubricant is formed into a collimated molecular beam by expanding lubricant vapor in a source chamber through a first collimating orifice and then passing the vapor through at least one additional collimating orifice located in a wall of at least one further chamber positioned downstream of the first collimating orifice.

In another preferred embodiment, the lubricant is converted into a non-collimated molecular beam by entraining vaporized lubricant molecules in a carrier gas, and applying the lubricant at ambient pressure.

In an embodiment of the present invention, an apparatus for generating and applying a collimated molecular beam of lubricant onto at least a selected portion of a magnetic recording medium comprises:

a heatable source chamber for containing and vaporizing liquid lubricant, the source chamber comprising a wall portion having a first collimating orifice therein for passing vaporized lubricant molecules therethrough;

a second chamber, in fluid communication with the source chamber via the first orifice, the second chamber comprising a wall portion having a second collimating orifice positioned downstream of the first collimating orifice; and a holder for positioning a surface of the magnetic recording medium in an evacuable chamber, opposite the second collimating orifice, for impinging the collimated lubricant beam thereon to form a thin film of lubricant on at least the selected portion.

Another embodiment includes an apparatus for generating and applying a non-collimated molecular beam of lubricant onto at least a selected portion of a surface of a magnetic recording medium, which apparatus comprises:

a heatable source chamber for containing and vaporizing liquid lubricant;

a carrier gas source for supplying a flow of inert carrier gas into the source chamber for entraining vaporized lubricant molecules therein;

a heated transfer conduit having a first end terminating interiorly of the source chamber and having a second, remote end terminating in a nozzle, wherein the transfer conduit supplies vaporized lubricant molecules entrained in the inert gas to the nozzle; and a holder for positioning a surface of said magnetic media, at ambient atmosphere, in close proximity to the nozzle for impinging the non-collimated lubricant beam thereon to form a thin film of lubricant on at least the selected surface portion.

Additional objects and advantages of the present invention will become readily apparent to those skilled in the art from the following detailed description, wherein only the preferred embodiments of the invention are shown and described, simply by way of illustration but not limitation. As will be realized, the invention is capable of other and different embodiments, and its several details are capable of modification in various obvious respects, all without departing from the invention. Accordingly, the drawings and description are to be regarded as illustrative in nature, and not as restrictive.

DESCRIPTION OF THE PREFERRED EMBODIMENTS

Lubricants conventionally employed in manufacturing magnetic recording media typically comprise mixtures of long chain polymers characterized by a wide distribution of molecular weights and include perfluoropolyethers, functionalized perfluoropolyethers, perfluoropolyalkylethers, and functionalized perfluoropolyalkylethers. The molecular weight of a lubricant affects the mechanical performance of the interface and, as a consequence, optimal ranges of molecular weight distribution are typically determined for a particular lubricant. Lubricants of such specific, optimal molecular weight distribution are prepared by fractionating the lubricant mixtures prior to adding the lubricant to the solvent bath, such conventional methodology being termed "pre-fractionation". The present invention departs from such conventional "pre-fractionation" methodology by simplifying or eliminating pre-fractionation and the requirement for a solvent. In addition, embodiments of the present invention enable selective coating of a particular area (i.e., localized zone) rather than indiscriminate application of a lubricant coating, thereby reducing lubricant consumption and improving product characteristics.

Figure 1:
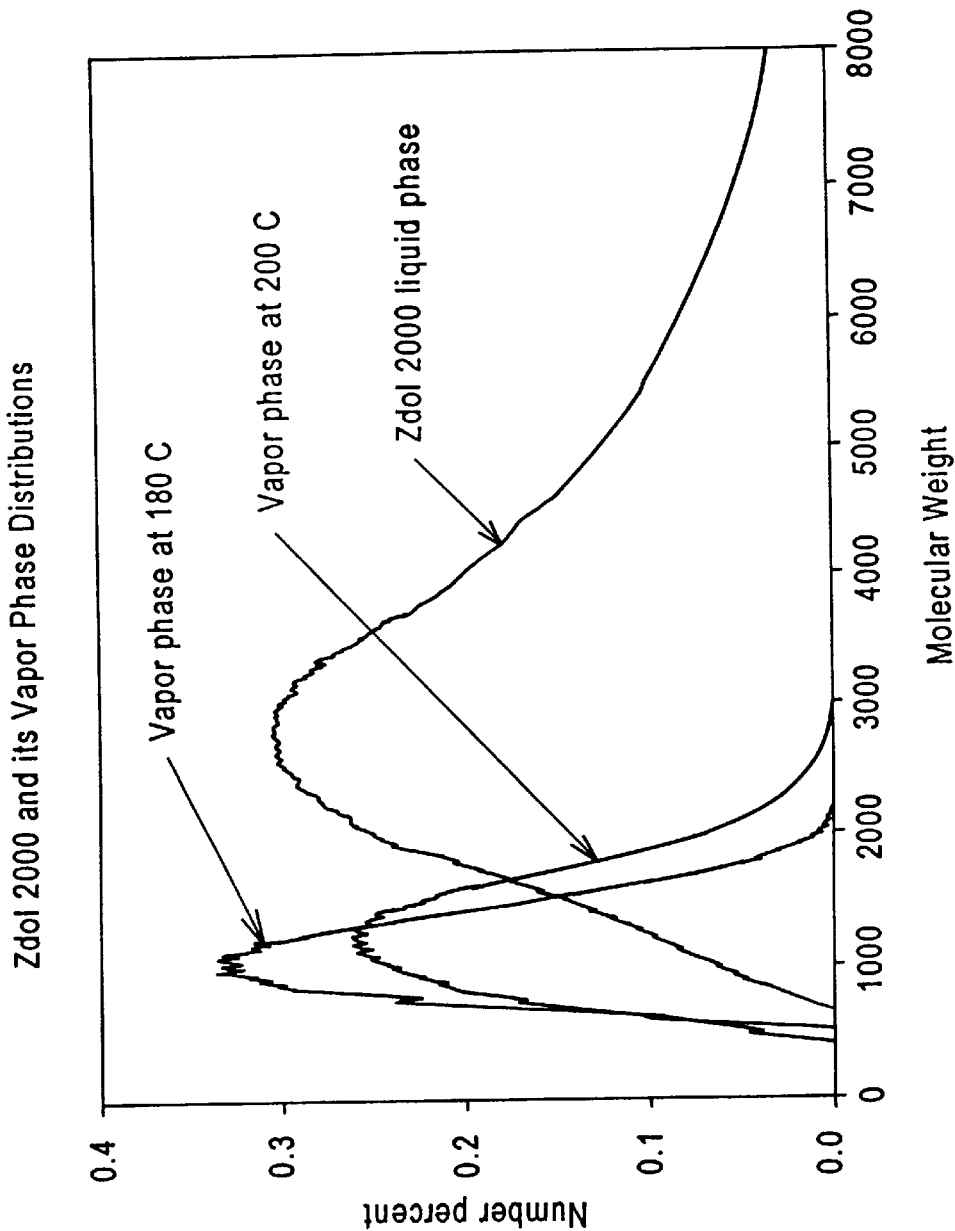
FIG. 1 is a graph showing the molecular weight distributions of a polymeric lubricant in the liquid and vapor phases.
Figure 2:
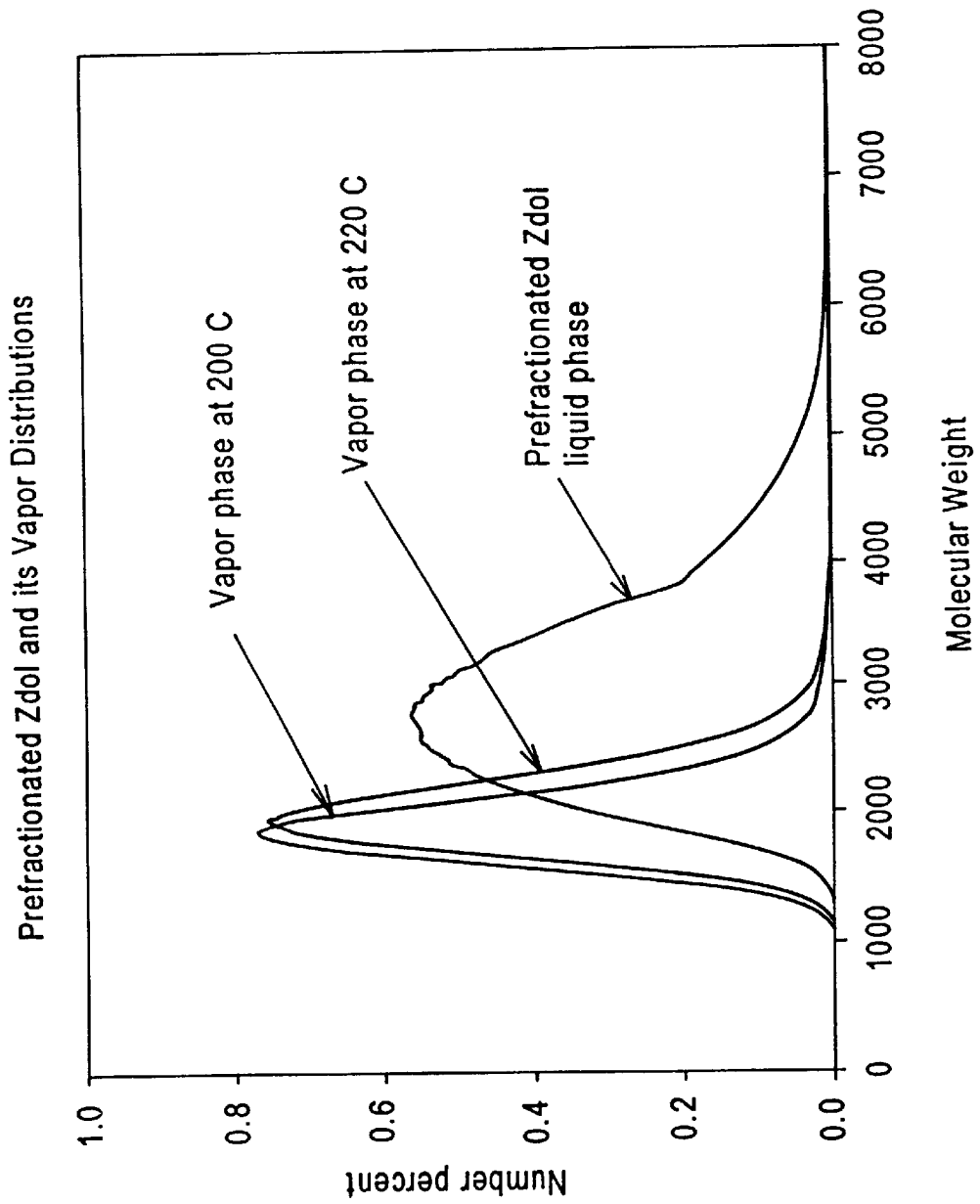
FIG. 2 is a graph showing the molecular weight distribution of a prefractionated polymeric lubricant in the liquid and vapor phases.

After investigation and experimentation, it was found, that since the molecular weight distribution of the commonly employed polymeric lubricants in the vapor phase is generally narrower and of lighter mean molecular weight than the associated equilibrium liquid phase, the vaporized rather than liquid lubricant can advantageously be employed in the manufacture of magnetic recording media such as magnetic discs. For example, considering the polymeric lubricant shown in FIGS. 1–2 (Zdol 2000, a perfluoropolyether lubricant available from Ausimont, Thorofare, N.J.), the molecular weight distribution in the vapor phase is significantly narrower than that of the liquid phase and is centered around a peak corresponding to a substantially lower molecular weight. Moreover, as is apparent from FIG. 2, the effect is obtainable even with pre-fractionated lubricant. It was found that use of lubricant vapor rather than lubricant liquid by vaporizing lubricant liquid results in an in-situ and on demand lubricant fractionation method, thereby obviating the need for a separate pre-fractionation process. Alternatively, a pre-fractionated lubricant can be employed with a somewhat different vapor phase molecular weight distribution (comparing FIGS. 1 and 2).

In addition to use with polymeric lubricant materials as hereinabove described, the present invention enjoys utility with a variety of other types of lubricant materials, including, but not limited to, monomeric oils and high vapor pressure solids.

Figure 3:
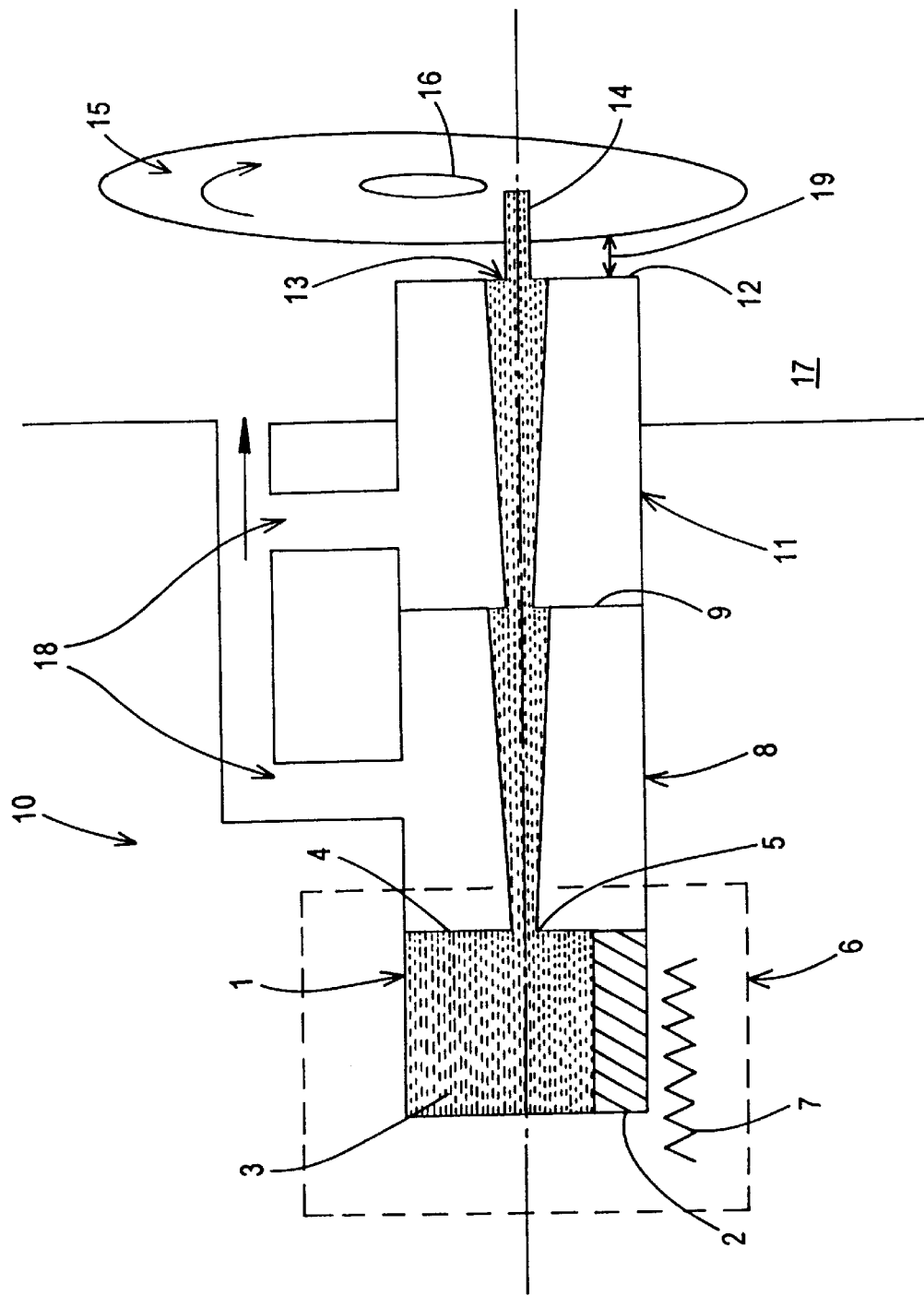
FIG. 3 is a cross-sectional schematic diagram of a first embodiment of the present invention for producing a collimated beam of vaporized lubricant molecules for application to a surface of a magnetic disc.

An embodiment of the present invention is illustrated in FIG. 3, and comprises an apparatus for vaporizing a lubricant and forming the vaporized lubricant into a collimated molecular beam for impinging on at least a selected portion of a magnetic recording medium, such as a magnetic disc. As illustrated, apparatus 10 comprises an in-line series of evacuable chambers in fluid communication through orifices formed in vertically extending walls which partition the apparatus into the various chambers. Source chamber 1 contains an amount of liquid lubricant 2 therein in equilibrium with lubricant vapor 3. A vertically extending wall portion 4 of source chamber 1 is formed with a first collimating orifice 5 for passing vaporized lubricant molecules therethrough. Source chamber 1 is provided with a heat source for effecting heating and vaporization of the liquid lubricant. In the illustrated embodiment, source chamber 1 is surrounded by oven 6 including resistance heater 7. Other suitable apparatus can be employed for heating and vaporizing the lubricant, e.g., a heater located interiorly of the source chamber 1.

At least one intermediate chamber 8 is provided in fluid communication with the source chamber 1 via first collimating orifice 5, and comprises a vertical wall in common with wall 4 of source chamber 1 and an opposing wall 9 formed with a second collimating orifice 10 for passing a beam of vaporized lubricant molecules therethrough. Although the illustrated apparatus includes only one such intermediate chamber, several additional, similarly constituted intermediate chambers can be provided. Intermediate chamber 8 is in fluid communication via second collimating orifice 10 with an end chamber 11 having a vertical wall in common with wall 9 of intermediate chamber 8 and an opposing wall 12 having a final collimating orifice 13 for passing a collimated beam 14 of vaporized lubricant molecules therethrough to impinge and deposit a thin film of fractionated lubricant on at least a selected portion of the surface of magnetic disc 15 positioned on rotating disc holder 16 to receive the collimated beam of lubricant molecules exiting from the final collimating orifice 13.

Rotatable disc holder 16 with magnetic disc 15 thereon are located within vacuum chamber 17 at a spacing 19 from final collimating orifice 13. In the illustrated embodiment, vacuum chamber 17 is shown in fluid communication with the intermediate and end chambers 8, 11 via conduits 18, whereby a common vacuum pump may be utilized. However, conduits 18 can be connected to a separate vacuum source. The pressure within the chambers between the collimating orifices should be kept sufficiently low so that the mean free path of the lubricant molecules is larger than that of the inter-orifice distance. In addition, a low pressure in the inter-orifice spaces can be maintained with minimal pumping, as by cooling the chamber surfaces due to the low vapor pressures of the polymeric lubricants at room temperature and below. The combination of the molecular beam and rotating disc defines a radial band of lubricant on the surface of the disc. The width of the band can be determined by the diameter of the final orifice and the position of the disc in relation to the lubricant beam to coincide with any desired zone(s) of the disc, e.g. the landing and take-off zone.

The series of collimating orifices of the inventive apparatus provides successive collimation of the vaporized lubricant molecules into a finely focussed beam. The ultimate diameter of the beam is determined by the size of the final collimating orifice 13, typically circularly shaped and with a diameter in the range from about 0.20 cm to about 0.60 cm, with about 0.40 cm being preferred. The spacing 19 between the final orifice 13 and the rotating disc 15 is typically between about 2 cm and 30 cm, preferably about 10 cm.

During operation, the pressure in the at least one intermediate chamber and the final chamber is maintained at about $10^{-7}$ Torr to about $10^{-9}$ Torr, preferably about $10^{-8}$ Torr. A suitable length (in the direction of the collimated molecular beam) of the at least one intermediate chamber for these pressures is about 10 cm to about 40 cm, preferably about 20 cm, while a suitable length of the end chamber is about 10 cm to about 40 cm, preferably about 20 cm. The length of each of the chambers will depend upon the number of chambers in the apparatus. The overall length of an assembly of chambers is in the range of about 20 cm to about 80 cm, and is preferably about 40 cm.

EXAMPLE

A liquid polymeric lubricant 2 comprising a perfluoropolyether was supplied to source chamber 1 of an apparatus substantially as depicted in FIG. 3. A collimated beam of lubricant molecules was formed by first expanding lubricant vapor 3 from source chamber 1 through first orifice 5. The vapor pressure and molecular weight distribution of the lubricant source 1 were controlled by selecting an initial liquid phase distribution and then heating the lubricant 2 by means of oven and heater 6, 7 to a temperature in the range of 100° C. to about 290° C. A thin film of lubricant was thereby satisfactorily selectively applied to the landing and take-off area of a magnetic disc.

Figure 4:
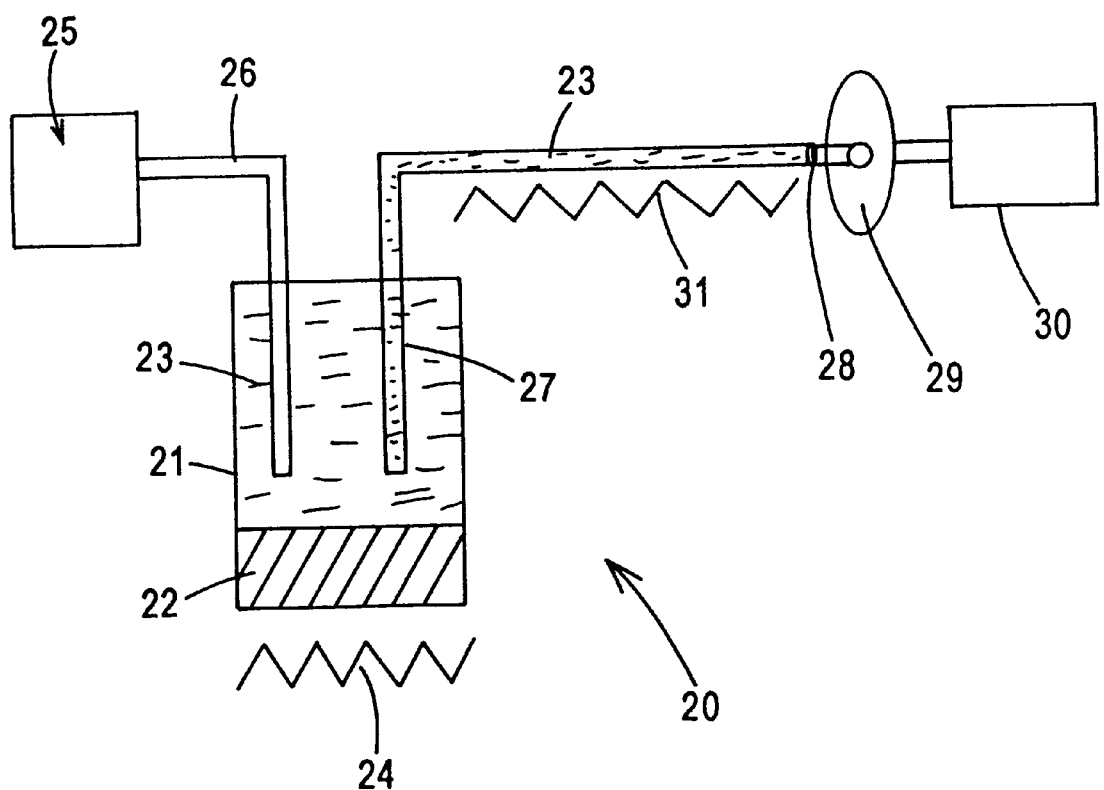
FIG. 4 is a cross-sectional schematic diagram of a second embodiment of the present invention for producing a non-collimated beam of vaporized lubricant molecules for application to a surface of a magnetic disc under ambient atmospheric conditions.

Another embodiment of the invention for producing a non-collimated molecular beam of lubricant is shown in FIG. 4. The FIG. 4 embodiment advantageously operates in ambient atmosphere. As schematically shown in FIG. 4, apparatus 20 comprises a suitable vessel 21 for containing liquid lubricant 22 which is subjected to heating by heater 24 to form vaporized lubricant 23 in the space above the liquid. A carrier gas, typically air or an inert gas such as nitrogen, argon, krypton, or neon, preferably nitrogen, is supplied from source 25 at controlled humidity to the vaporized lubricant 23 via supply conduit 26 which terminates within the vessel 21 in the vapor space at a distance above the liquid 22 level. In practice, when employing polymeric lubricants such as perfluorpolyethers, the liquid lubricant 22 is typically heated to a temperature of from about 100 C. to about 250° C., preferably about 200° C.

The carrier gas source 25 includes flow control and pressure regulator means (not shown) for supplying the carrier gas at a rate and pressure sufficient to entrain vaporized lubricant molecules therein, and to cause the carrier gas with entrained vaporized lubricant molecules to flow out of vessel 21 via transfer conduit 27 having one end which terminates within the vessel 21 in the vapor space at a distance above the liquid 22 level. The remote end of conduit 27 terminates in a nozzle 28 which may be formed of a tube of inner diameter equal to or slightly less than that of the selected area of the medium to which a lubricant film is selectively applied, e.g., the landing zone of a magnetic recording medium having an inner diameter of about 0.20 cm to about 0.60 cm, preferably about 0.40 cm.

In the FIG. 4 embodiment, a magnetic disc 29 is positioned in close proximity to nozzle 28 in order to prevent expansion of the vaporized lubricant stream prior to condensation on the disc surface. In addition, the disc is rotated during lubricant application via motor 30 in order to form a radially extending band of lubricant on the disc surface.

Heater 31 is provided adjacent conduit 27 to heat the major extent thereof, including the nozzle portion 28, to a temperature about 10° C. to about 50° C., preferably about 20° C. higher than that of the liquid lubricant, for preventing condensation of vaporized lubricant on the inner surfaces thereof. As in the embodiment shown in FIG. 3, the source vessel 21 may be contained within an oven, in which case heater 24 may form part of the oven or be located within the liquid lubricant 22. Apparatus 20 can also include a number of other features which are, for the sake of illustrative simplicity, not depicted, such as shutoff and bypass valves, temperature sensors and controllers, the utility of which conventional elements should be apparent.

Only preferred embodiments of the present invention and an example of its utility are shown and described in the present disclosure. It is to be understood that the invention is capable of use in other environments and is susceptible of changes or modifications within the scope of the inventive concept(s) as presented therein.

What is claimed is:

1. A method for applying a lubricant film to a surface of a magnetic media, which method comprises:

vaporizing the lubricant;

forming the vaporized lubricant into a beam of vaporized lubricant molecules; and directing the molecular beam toward the surface of the magnetic media to impinge thereon, thereby depositing a film of the lubricant on at least a preselected portion of the surface.

2. The method according to claim 1, wherein the lubricant is solvent-free.

3. The method according to claim 2, wherein the lubricant comprises a polymeric material having a distribution of molecular weights and the polymeric material is fractionated into a material having a narrower molecular weight distribution and lower mean weight during vaporization.

4. The method according to claim 3, wherein the polymeric lubricant material comprises at least one member of the group consisting of perfluoropolyethers, functionalized perfluoropolyethers, perfluoropolyalkylethers, and functionalized perfluoropolyalkylethers.

5. The method according to claim 2, wherein the lubricant comprises a monomeric oil or a high vapor pressure solid material.

6. The method according to claim 1, wherein the magnetic media comprises a magnetic disc, further comprising rotating the disc during deposition of the lubricant film and applying the lubricant to a radial band of said disc, the radial band including a landing and take-off zone for a read-write head.

7. The method according to claim 1, comprising forming the lubricant into a collimated molecular beam.

8. The method according to claim 7, comprising expanding lubricant vapor in a source chamber through a first collimating orifice and then passing the vapor through at least one additional collimating orifice located in a wall of at least one further chamber positioned downstream of the first collimating orifice;

maintaining the pressure in the at least one further chamber sufficiently low such that the mean free path of the vaporized lubricant molecules is larger than the length dimension of the at least one further chamber;

cooling the surfaces of the at least one further chamber, whereby minimal vacuum pumping is required to maintain said sufficiently low pressure;

passing the collimated molecular beam through a final orifice prior to impinging at least the preselected portion of said surface, and the width of the impinging beam is determined by the size of said final orifice; and positioning the magnetic recording medium within an evacuated chamber.

9. The method according to claim 1, comprising forming a non-collimated molecular beam.

10. The method according to claim 9, comprising entraining vaporized lubricant molecules in a carrier gas comprising air or an inert gas by flowing the carrier gas through a heated source chamber containing the lubricant;

directing the lubricant entrained carrier gas toward at least the preselected portion of the surface through a conduit terminating in a nozzle comprising a heated tube of preselected inner diameter positioned in close proximity to the surface; and depositing the entrained lubricant molecules on at least the preselected portion of said surface at ambient pressure.

11. An apparatus comprising:

a holder for accommodating a magnetic recording medium; and means for applying a lubricant to the magnetic recording medium, wherein the means for applying the lubricant comprises means for applying a collimated or non-collimated beam of lubricant molecules onto at least a selected portion of a surface of the magnetic recording medium, wherein the selected portion comprises a radial band of a magnetic disc comprising a landing and take-off area for a read-write head.

12. The apparatus according to claim 11 wherein the holder is adapted to rotate the magnetic recording medium during impingement of the lubricant beam.

13. The apparatus according to claim 11 for generating and applying a collimated molecular beam of lubricant, comprising:

a heatable source chamber for containing and vaporizing said lubricant material, said source chamber including a wall portion having a first collimating orifice therein for passing vaporized lubricant molecules therethrough;

a second chamber, in fluid communication with the source chamber via the first orifice, the second chamber a second chamber, in fluid communication with the source chamber via the first orifice, the second chamber including a wall portion having a second collimating orifice positioned downstream of said first collimating orifice; and said holder adapted for positioning a surface of the magnetic recording medium in an evacuable chamber, opposite the second collimating orifice, for impinging the collimated lubricant beam thereon to form a thin film of lubricant on at least the selected portion; and at least one additional chamber between the source chamber and the second chamber in fluid communication therewith, the at least one additional chamber including a wall portion having a third collimating orifice intermediate the first and second collimating orifices.

14. The apparatus according to claim 13, further comprising a vacuum source for maintaining the pressure in the second and additional chamber(s) at a sufficiently low pressure such that the mean free path of vaporized lubricant molecules is larger than the length of the second and additional chamber(s).

15. The apparatus according to claim 14, further comprising a cooler for cooling the surfaces of the second and additional chamber(s).

16. The apparatus according to claim 11, for generating and applying a non-collimated molecular beam of lubricant, comprising:

a heatable source chamber for containing and vaporizing a lubricant material;

a carrier gas source for supplying a flow of inert carrier gas into the source chamber for entraining vaporized lubricant molecules therein;

a transfer conduit having a first end terminating interiorly of the source chamber and having a second, remote end terminating in a nozzle, wherein the transfer conduit supplies vaporized lubricant molecules entrained in the inert gas to the nozzle; and a holder for positioning a surface of the magnetic recording medium, at ambient atmosphere, in close proximity to the nozzle for impinging the non-collimated lubricant beam thereon, to form a thin film of lubricant on at least the selected surface portion.

17. The apparatus according to claim 16, wherein the holder is adapted to rotate the magnetic recording medium during impingement of the lubricant beam.

18. The apparatus according to claim 16, further comprising a heater for heating the transfer line.

19. The apparatus according to claim 16, wherein the diameter of the nozzle is equal to or slightly less than a dimension of the selected surface area portion.

* * * * *